(12) United States Patent
Gantioler

(10) Patent No.: US 6,320,448 B1
(45) Date of Patent: Nov. 20, 2001

(54) BRIDGE CIRCUIT FOR SWITCHING HIGH CURRENTS

(75) Inventor: Josef Gantioler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/658,715

(22) Filed: Sep. 11, 2000

(30) Foreign Application Priority Data

Sep. 9, 1999 (DE) ............................................. 199 43 146

(51) Int. Cl.⁷ ........................................................ H03K 17/56
(52) U.S. Cl. ............................................ 327/423; 327/424
(58) Field of Search ................................. 327/110, 423, 327/424, 427, 494, 508, 587, 588, 589; 257/370

(56) References Cited

U.S. PATENT DOCUMENTS

| 4,786,822 | * | 11/1988 | Steely | 307/125 |
| 5,081,517 | * | 1/1992 | Contiero et al. | 257/370 |
| 5,119,162 | * | 6/1992 | Todd et al. | 257/370 |
| 5,256,582 | * | 10/1993 | Mosher et al. | 438/206 |
| 5,294,823 | * | 3/1994 | Eklund et al. | 257/370 |
| 5,642,247 | * | 6/1997 | Giordano | 361/31 |
| 5,838,515 | * | 11/1998 | Mortazavi et al. | 360/78.12 |

* cited by examiner

Primary Examiner—Kenneth B. Wells
Assistant Examiner—Paul Dinh
(74) Attorney, Agent, or Firm—Herbert L. Lerner; Laurence A. Greenberg; Werner H. Stemer

(57) ABSTRACT

The bridge circuit for switching high currents has n (n=a natural integer) lowside and highside switches (T1 to T4) in the form of vertically structured MOS transistors on two separate chips. The highside switch is formed using DMOS technology. The lowside switches are formed using common-source technology with the source arranged on the rear side of the chip and the drain arranged on the front side of the chip. The drain is connected to the source of the associated highside switch.

9 Claims, 1 Drawing Sheet

BRIDGE CIRCUIT FOR SWITCHING HIGH CURRENTS

BACKGROUND OF THE INVENTION

Field of the Invention

The present invention relates to a bridge circuit for switching high currents, having n (n=a natural integer) lowside and highside switches in the form of vertically structured MOS transistors on two separate chips. The highside switch is formed using DMOS technology.

Such a bridge circuit is typically used in order to drive motors during direct-current and pulse-width-modulated operation, or to switch valves. The bridge circuit can be produced using different numbers of switches, with a half-bridge being produced if n=1, a full bridge or H-bridge being produced if n=2, a three-phase bridge being produced if n=3. An n-phase bridge is produced in the case of n.

A bridge circuit as mentioned above has become known heretofore from German patent DE 196 95 582 C1. There, all the switches of the bridge circuit, that is to say the lowside switches in addition to the highside switches, are formed using DMOS technology. In order to allow control at a high current level, the chips are arranged one above the other using so-called chip-on-chip mounting. The load paths of two mutually associated transistors are connected in series by virtue of the mounting. One embodiment provides for two highside transistors integrated on a common chip, and two lowside transistors on separate chips. The chip-on-chip mounting of that prior art bridge circuit is a relatively complicated process which, in particular, requires complicated bonding. Furthermore, it is known for bridge circuits to be produced as monolithic circuits for use with low currents, in particular using BCD-MOS technology. The major disadvantage of this implementation is the relatively low operating currents.

Finally, it is also known for the bridge circuit to be produced with discrete power transistors, that is to say with four power transistors for an H bridge circuit and a driver circuit in addition, which is either constructed from discrete components or is designed to be integrated. The discrete construction of the circuit variant admittedly allows large current loads to be switched, but it is time-consuming and occupies a large amount of space.

SUMMARY OF THE INVENTION

The object of the invention is to provide a bridge circuit for switching high currents which overcomes the above-noted deficiencies and disadvantages of the prior art devices and methods of this general kind, and which can be produced cost-effectively and ensures that large currents are switched.

With the above and other objects in view there is provided, in accordance with the invention, a bridge circuit for switching high currents, comprising:

two chips each having a front side and a rear side;
a number n, where n is an integer, of lowside and highside switches separately formed as vertically structured MOS transistors on the two chips;
the highside switch having a source;
the lowside switches being formed with common-source technology and having a source arranged on the rear side of the chip, a drain arranged on the front side of the chip, and a drain connected to the source of an associated the highside switch.

In other word, the lowside switches are implemented in common-source technology with the source arranged on the rear side of the chip, and the drain arranged on the front side of the chip. This results in a bridge circuit in which all the transistors are bonded on an active surface, and high currents an thus be switched with an Ronwhich is as low as possible.

This circuit furthermore has the advantage that all the possible configurations of the bridge circuit, with 1, 2, 3 or more transistors per chip, can be produced on only two chips. The capability for integrated production has major cost advantages in comparison to the previous bridge circuits mentioned initially.

In accordance with an added feature of the invention, the drains of the transistors of the highside switches are advantageously connected to one another. This connection of the drains of the transistors is carried out in a simple manner by means of leadframes or connecting frames integrated in the chips, and which also provide connections for external components.

In accordance with an additional feature of the invention, a control IC for driving the highside and lowside switches is connected to the switches and integrated in one of the chips containing the highside and lowside switches.

In accordance with another feature of the invention, the control IC is integrated in the chip with bipolar CMOS technology.

In accordance with a further feature of the invention, each of the chips has an integrated control IC for driving the highside and lowside switches, respectively.

In accordance with again an added feature of the invention, a dedicated leadframe or connecting frame is provided on each of the chips for interconnecting the transistors and for connecting external components.

In accordance with a concomitant feature of the invention, the highside switches are formed using DMOS technology or, alternatively, using smart technology.

While, in the prior art devices, the control circuits for the highside and lowside switches have been produced on separate chips or constructed as discrete components, the invention advantageously provides that a control IC for driving the highside and lowside switches jointly is integrated in the chip containing the highside or lowside switches. As an alternative to this, two separate control ICs can be provided, one of which is used specifically for driving the highside switches, while the other is used to control the lowside switches. The respective control IC is implemented in a space-saving manner on the associated chip, that is to say the chip on which the lowside switches are integrated, or the chip on which the highside switches are integrated, and, with suitable technology, allows the production process to be simplified, above all using bipolar CMOS technology.

Other features which are considered as characteristic for the invention are set forth in the appended claims.

Although the invention is illustrated and described herein as embodied in a bridge circuit for switching high currents, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
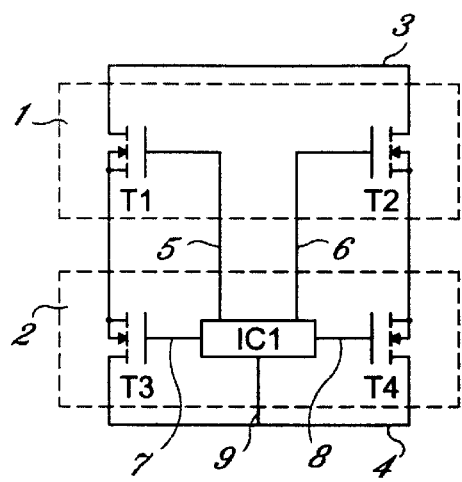
FIG. 1 is a circuit schematic of a first embodiment of the bridge circuit according to the invention.

Referring now to the figures of the drawing in detail and first, particularly, to FIG. 1 thereof, there is seen an embodiment of the bridge circuit according to the invention, with a first chip 1 and a second chip 2. These chips 1, 2 are arranged directly alongside one another and each comprise two transistors, which form the switching elements of the bridge circuit. Accordingly, the first chip 1 comprises two highside switches in the form of a transistor T1 and a transistor T2, and the second chip 2 contains two lowside switches in the form of transistors T3 and T4. This switch configuration is referred to as an H-bridge. Furthermore, the circuit shown in FIG. 1 comprises a first leadframe island 3 connected to the first chip 1, and a second leadframe island 4 connected to the second chip 2.

The transistors T1 and T2 are typically vertical DMOS transistors, that is to say so-called SFETs. Alternatively, the transistors T1 and T2 may be produced using the so-called vertical smart technology, as S-smart. The choice of the respective technology depends on the specific requirements of the bridge circuit. The essential factor is that a low $R_{on}$ can be achieved by using either technology, to be precise depending on the generation of the respective technology.

The drains of the transistors T1 and T2 are connected to one another on the basis of the production technology, and also make contact with the leadframe island 3.

The transistors T3 and T4 on the second chip 2 are so-called common-source transistors which, on the basis of their production process, have a common source and make contact with the leadframe island 4. The common-source technology is preferably designed in such a way that it contains a vertical MOS transistor, whose source is located on the rear side, and whose drain is located on the front side.

The transistors T1 to T4 are connected to one another in pairs, corresponding to the bridge circuit technology. All the transistors T1 and T4, namely both the transistors T3 and T4 produced using common-source technology and the transistors T1 and T2 alternatively produced using DMOS technology or smart technology, are in each case distinguished by an $R_{on}$ which is as low as possible, so that the bridge circuit is able to even switch high currents without any problems.

A special feature of the bridge circuit shown in FIG. 1 is, also, that a control circuit is provided between the two transistors T3 and T4 on the chip 2, in addition to the transistors T3 and T4. The control circuit is integrated using bipolar CMOS technology and allows the four transistors T1 to T4 to be controlled in accordance with the basic principle of the bridge circuit, as is shown schematically in FIG. 1 by means of control lines 5, 6, 7, 8, which run to the transistors T1 to T4. Furthermore, the IC1 makes contact with the leadframe island 4 via a line 9.

Figure 2:
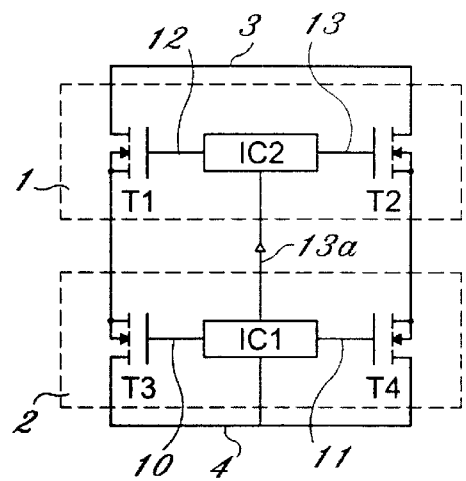
FIG. 2 is a circuit schematic of a second embodiment of the bridge circuit according to the invention.

Referring now to FIG. 2, there is shown a modification of the bridge circuit of FIG. 1. The same reference symbols are used for identical components in the two circuits, and only the difference between the circuit of FIG. 2 and that of FIG. 1 will be detailed in the following text. The difference is that a control circuit in the form of an IC2 is also integrated in the first chip 1. This IC2 is used to control the transistors T1 and T2 on the first chip 1, while the IC1, which is provided on the second chip 2, is used to control the transistors T3 and T4. The control process is carried out via control lines, with the IC1 being connected via a control line 10 to the transistor T3, and via a control line 11 to the transistor T4. The IC2 is similarly connected via a control line 12 to the transistor T1, and via a control line 13 to the transistor T2. Furthermore, the two control circuits IC1 and IC2 are connected to one another via a line 13a.

Figure 3:
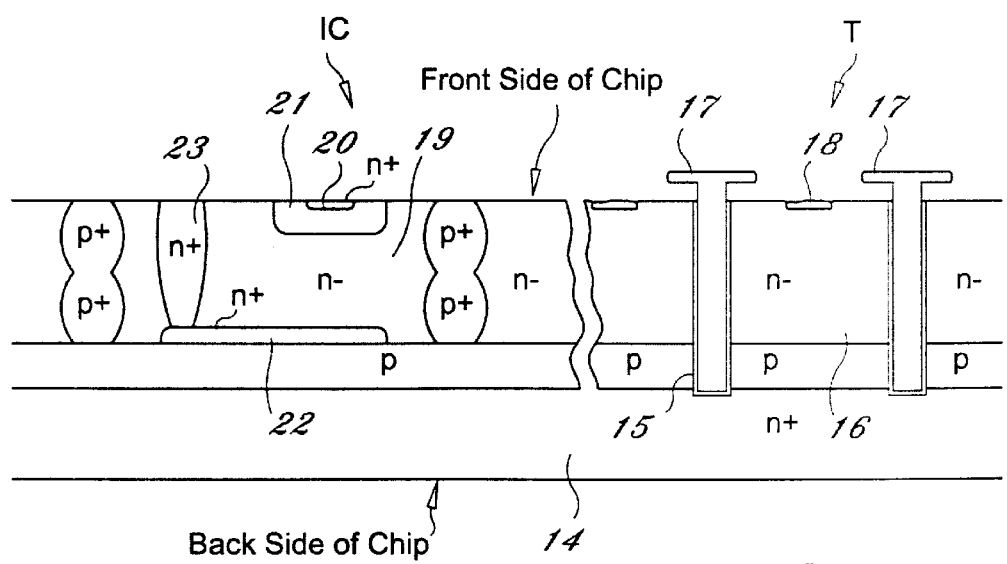
FIG. 3 is a diagrammatic section illustrating the layer structure of the highside chip in FIG. 1 in the area of a transistor and the control IC.

Referring now to FIG. 3, there is shown the layer structure of the second chip 2 of FIG. 1 and of FIG. 2 in the area of one of the transistors T3 and T4 provided there and in the area of the control circuit, the IC1.

In detail, the transistor structure is denoted by T in FIG. 3, and the IC structure is denoted by IC.

As noted above, the transistor T is constructed using common-source technology and comprises a substrate 14 which at the same time forms the source of the common-source transistor T. The channel region of this transistor is denoted by the reference symbol 15. The drift region of this transistor is denoted by the reference symbol 16. The gate of this transistor is denoted by the reference symbol 17, and the drain terminal of this transistor is denoted by the reference symbol 18. The $n^-$-island, produced by means of a BICMOS process and insulated from the surrounding p-regions, is denoted by the reference symbol 19. Very widely differing components can be produced in these islands as parts of the control circuit, namely, for example, a low-voltage CMOS transistor, an NPN transistor, a PNP transistor, a DMOS transistor, a zener diode and the like. An NPN transistor is shown only by way of example. Its emitter is denoted by the reference symbol 20, while its base is denoted by the reference symbol 21. The reference symbol 22 denotes a buried layer, and the reference symbol 23 denotes the collector depth.

I claim:

1. A bridge circuit for switching high currents, comprising:

two chips each having a front side and a rear side;
a number n, where n is an integer, of lowside and highside switches separately formed as vertically structured MOS transistors on said two chips:
said highside switch having a source;
said lowside switches being formed with common-source technology and having a source arranged on said rear side of one of said two chips, a drain arranged on said front side of said one of said two chips, and a drain connected to said source of an associated said highside switch.

2. The circuit according to claim 1, wherein said transistors of said highside switches have drains connected to one another.

3. The circuit according to claim 1, which comprises a control IC for driving said highside and lowside switches connected to said switches and integrated in one of said chips containing said highside and lowside switches.

4. The circuit according to claim 3, wherein said control IC is integrated in one of said two chips with bipolar CMOS technology.

5. The circuit according to claim 1, which comprises a control IC for driving said highside switches integrated in one of said two chips containing said highside switches, and a further control IC for controlling said lowside switches integrated in another one of said two chips containing said lowside switches.

6. The circuit according to claim 5, wherein said control ICs are integrated in said chips with bipolar CMOS technology.

7. The circuit according to claim 1, which comprises a dedicated leadframe or connecting frame on each of said chips for interconnecting said transistors and for connecting external components.

8. The circuit according to claim 1, wherein said highside switches are formed using DMOS technology.

9. The circuit according to claim 1, wherein said highside switches are formed using smart technology.

* * * * *